United States Patent
Kinoshita et al.

(10) Patent No.: US 8,343,870 B2
(45) Date of Patent: Jan. 1, 2013

(54) SEMICONDUCTOR DEVICE AND METHOD OF MANUFACTURING THE SAME

(75) Inventors: Atsuhiro Kinoshita, Kanagawa (JP); Junji Koga, Kanagawa (JP)

(73) Assignee: Kabushiki Kaisha Toshiba, Tokyo (JP)

(\*) Notice: Subject to any disclaimer, the term of this patent is extended or adjusted under 35 U.S.C. 154(b) by 39 days.

(21) Appl. No.: 12/585,034

(22) Filed: Sep. 1, 2009

(65) Prior Publication Data
US 2009/0325357 A1 Dec. 31, 2009

Related U.S. Application Data

(63) Continuation of application No. 11/812,609, filed on Jun. 20, 2007, now abandoned.

(30) Foreign Application Priority Data

Jun. 21, 2006 (JP) .................................. 2006-171593

(51) Int. Cl.
 *H01L 21/44* (2006.01)
(52) U.S. Cl. ............... 438/682; 257/346; 257/E21.409; 438/301; 438/591; 438/592
(58) Field of Classification Search .................. 257/346, 257/E21.409; 438/301, 591, 682, 592
See application file for complete search history.

(56) References Cited

U.S. PATENT DOCUMENTS

| | | | |
|---|---|---|---|
| 5,702,972 A * | 12/1997 | Tsai et al. | ...................... 438/305 |
| 6,090,692 A | 7/2000 | Song | |
| 6,121,090 A * | 9/2000 | Wu | ................................ 438/275 |
| 6,150,243 A * | 11/2000 | Wieczorek et al. | ............ 438/558 |
| 6,194,748 B1 | 2/2001 | Yu | |
| 6,461,923 B1 * | 10/2002 | Hui et al. | ...................... 438/305 |
| 6,670,250 B2 * | 12/2003 | Lee | ................................ 438/301 |
| 6,770,522 B2 | 8/2004 | Okumura et al. | |
| 6,881,657 B2 | 4/2005 | Torii et al. | |
| 6,913,980 B2 | 7/2005 | Wu et al. | |

(Continued)

FOREIGN PATENT DOCUMENTS

JP 2001-237421 8/2001

(Continued)

OTHER PUBLICATIONS

Zhao et. al., Tuning of Schottky barrier heights by silicidation induced impurity segregation, Aug. 2006, International Workshop on Junction Technology, pp. 147-152.*

(Continued)

*Primary Examiner* — John C Ingham
(74) *Attorney, Agent, or Firm* — Finnegan, Henderson, Farabow, Garrett & Dunner, L.L.P.

(57) ABSTRACT

A semiconductor device which can effectively suppress a short channel effect and junction leakage is provided. A semiconductor device includes a field effect transistor. The field effect transistor includes a first semiconductor region of a first conductivity type, a gate electrode formed on a gate insulating film, and source and drain electrodes. The field effect transistor also includes second semiconductor regions of a second conductivity type. The field effect transistor further includes third semiconductor regions of the second conductivity type having an impurity concentration higher than that of the second semiconductor region and formed between the source electrode and the first and second semiconductor regions and between the drain electrode and the first and second semiconductor regions, and side wall insulating films formed on both the side surfaces of the gate electrode. The source electrode and the drain electrode are separated from the side wall insulating films.

13 Claims, 20 Drawing Sheets

U.S. PATENT DOCUMENTS

| | | | |
|---|---|---|---|
| 7,119,402 B2 | 10/2006 | Kinoshita et al. | |
| 7,446,043 B2 | 11/2008 | Park et al. | |
| 7,825,493 B2 * | 11/2010 | Ikeda | 257/616 |
| 2002/0146904 A1 | 10/2002 | Buynoski et al. | |
| 2005/0093033 A1 * | 5/2005 | Kinoshita et al. | 257/288 |
| 2007/0007590 A1 | 1/2007 | Kinoshita et al. | |

FOREIGN PATENT DOCUMENTS

| | | |
|---|---|---|
| JP | 2002-100764 | 4/2002 |
| JP | 2005-101588 | 4/2005 |

OTHER PUBLICATIONS

Uchida, et al., "Enhancement of hot-electron generation rate in Schottky source metal-oxide-semiconductor field-effect transistors", Applied Physics Letters, vol. 76, No. 26, pp. 3992-3994, (Jun. 26, 2000).

Notification of Reason(s) for Refusal issued by the Japanese Patent Office on Mar. 31, 2009, for Japanese Patent Application No. 2006-171593, and English-language translation thereof.

Notification of Reason(s) for Refusal issued by the Japanese Patent Office on Aug. 29, 2008, for Japanese Patent Application No. 2006-171593, and English-language translation thereof.

Notification of the Second Office Action issued by the Chinese Patent Office on Sep. 11, 2009, for Chinese Patent Application No. 200710112042.4, and English-language translation thereof.

Office Action issued by the Taiwan Intellectual Property Office on Oct. 21, 2011, for Taiwanese Patent Application No. 096121025, and English-language translation thereof.

* cited by examiner

SEMICONDUCTOR DEVICE AND METHOD OF MANUFACTURING THE SAME

CROSS-REFERENCE TO RELATED APPLICATION

This application is a continuation of application Ser. No. 11/812,609, filed Jun. 20, 2007 now abandoned, and is based upon and claims the benefit of priority from the prior Japanese Patent Application No. 2006-171593 filed Jun. 21, 2006 in Japan, the entire contents of all of which are incorporated herein by reference.

FIELD OF THE INVENTION

The present invention relates to a semiconductor device and a method of manufacturing the same, and more particularly, to a semiconductor device having a MIS field effect transistor the source and drain portions of which are improved and a method of manufacturing the same.

BACKGROUND OF THE INVENTION

To advance the performance of a semiconductor integrated circuit, the performance of a field effect transistor serving as a constituent device must be advanced. For advancing the device performance, scaling down of the device is effective. For this reason, device performance has been improved by scaling down the device by micro patterning. However, as micro patterning advanced, a technical barrier to be solved becomes high at the same time. According to the international semiconductor roadmap, especially in relation to a technique for forming source and drain portions, a solution for realizing a junction having a depth of 10 to 20 nm in a drain-extension portion in the 65-nm generation or later cannot be found in the existing circumstances.

In this background, in order to improve both suppression of short channel effect and reduction of junction leakage, a device using Schottky source and drain to which an impurity segregation technique is applied is proposed (JP-A 2005-101588 (KOKAI)). In particular, in the 45-nm generation or later, a channel resistance caused by scattering of carriers is not a prevailing factor that degrades a drain current because of a small gate length. For this reason, improvement of device performance relying only to micro patterning is very difficult. Therefore, in order to realize further improvement of performance, a device using a Schottky source-drain maximally utilizing the characteristic feature of a Schottky junction which can inject high-speed carriers into a channel is desired (K. Ucida et al., Appl. Phys. Lett., 76, 3992 (2000)). However, a device structure using a conventional Schottky source-drain has the following problem. That is, the merit of the Schottky source-drain which can inject high-speed carriers into a channel is not always maximally utilized.

Thus, the device using a conventional Schottky source-drain has a merit for short channel effect and suppression of junction leakage. However, the merit of the Schottky source-drain which can inject high-speed carriers into a channel is not always maximally utilized. More specifically, in order to improve the device performance by using an increase in rate of injection by the Schottky source-drain, a device structure must be optimized. However, up to now, it cannot be said that the device structure is optimized.

SUMMARY OF THE INVENTION

The present invention has been made in consideration of the above circumstances. It is an object of the present invention to provide a semiconductor device having a field effect transistor with a device structure which can achieve improvement of performance by increasing an injection rate of carriers while effectively suppressing a short channel effect and junction leakage, and a method of manufacturing the semiconductor device.

A semiconductor device according to an embodiment of the present invention comprises a field effect transistor including: a first semiconductor region of a first conductivity type having a surface portion on which a channel region is formed; a gate electrode formed on the channel region, a gate insulating film in between the gate electrode and the channel region; a source electrode and a drain electrode formed on both the sides of the channel region; second semiconductor regions of a second conductivity type formed between the source electrode and the channel region and between the drain electrode and the channel region to serve as extension regions of a source and a drain; third semiconductor regions of the second conductivity type formed between the source electrode and the first and second semiconductor regions and between the drain electrode and the first and second semiconductor regions and having an impurity concentration higher than that of the second semiconductor region; and side wall insulating films formed on both the side surfaces of the gate electrode, the side wall insulating films being separated from the source electrode and the drain electrode.

A method for producing the field effect transistor according to another embodiment of the present invention comprises: forming a gate electrode on a first semiconductor region of a first conductivity type, a gate insulating film in between, and side wall insulating films on both side surfaces of the gate electrode; ion-implanting an impurity in the first semiconductor region by using the gate electrode and the side wall insulating film as masks to form second semiconductor regions of a second conductivity type serving as extension regions of a source and a drain; forming second side wall insulating films on both side surfaces of the side wall insulating film; and siliciding a part of the second semiconductor region of the second conductivity type to a region deeper than the second semiconductor region to form a source electrode and a drain electrode, and forming third semiconductor regions of the second conductivity type having an impurity concentration higher than that of the second semiconductor region in interfaces between the source electrode and the first and second semiconductor regions and between the drain electrode and the first and second semiconductor regions by segregation from silicide.

A method for producing the field effect transistor according to still another embodiment of the present invention comprises: forming a gate electrode on a first semiconductor region of a first conductivity type, a gate insulating film in between; forming side wall insulating films each having a footing-bottom shape at a lower surface side thereof on both side surfaces of the gate electrode; ion-implanting an impurity in the first semiconductor region by using the gate electrode and the side wall insulating film as masks to form second semiconductor regions of a second conductivity type serving as extension regions of a source and a drain; and siliciding a part of the second semiconductor region of the second conductivity type to a region deeper than the second semiconductor region to form a source electrode and a drain electrode, and forming third semiconductor regions of the second conductivity type having an impurity concentration higher than that of the second semiconductor region in interfaces between the source electrode and the first and second semiconductor regions and between the drain electrode and the first and second semiconductor regions by segregation from silicide.

A method for producing the field effect transistor according to still another embodiment of the present invention comprises: forming a gate electrode on a part of a first semiconductor region of a first conductivity type, a gate insulating film in between; depositing an insulating film serving as a side wall insulating film of the gate electrode; maximally etching the insulating film serving as the side wall insulating film by anisotropic etching not to expose an underlying layer; ion-implanting an impurity in the first semiconductor region from above the insulating film serving as the side wall insulating film to form second semiconductor regions of a second conductivity type serving as extension regions of a source and a drain; etching the insulating film serving as the side wall insulating film which is maximally etched not to expose the underlying layer to form side wall insulating films each having a footing-bottom shape at a lower surface side thereof on both side surfaces of the gate electrode, siliciding a part of the second semiconductor region of the second conductivity type to a region deeper than the second semiconductor region to form a source electrode and a drain electrode; and forming third semiconductor regions of the second conductivity type having an impurity concentration higher than that of the second semiconductor region in interfaces between the source electrode and the first and second semiconductor regions and between the drain electrode and the first and second semiconductor regions by segregation from silicide.

According to the present invention, there can be provided a semiconductor device having a field effect transistor with a device structure which can achieve improvement of performance by increasing an injection rate of carriers while effectively suppressing a short channel effect and junction leakage, and a method of manufacturing the semiconductor device.

DETAILED DESCRIPTION OF THE EMBODIMENTS

Embodiments of the present invention will be described below with reference to the drawings.

First Embodiment

Figure 1:
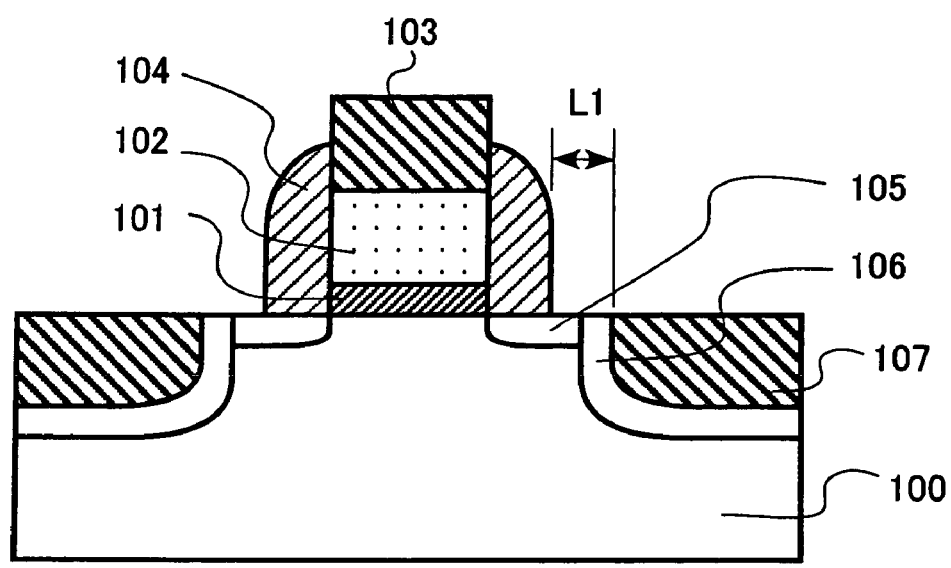
FIG. 1 is a cross-sectional view showing an device structure of a MIS field effect transistor according to a first embodiment.

FIG. 1 is a sectional view showing an device structure of a MIS field effect transistor according to a first embodiment.

A polysilicon gate electrode 102 is formed on a p-type silicon substrate (first semiconductor region) 100 a gate insulating film 101 in between. A gate silicide 103 is formed on the polysilicon gate electrode 102. In this case, the gate electrode 102 is made of polysilicon. However, a metal gate structure in which the polysilicon gate electrode 102 and the gate silicide 103 are replaced by a single metal layer may be employed.

On both the side surfaces of the gate electrodes 102 and 103, a gate side wall insulating film 104 constituted by a silicon nitride film is formed. Source and drain regions are formed in the silicon substrate 100 to interpose a channel region under the polysilicon gate electrode 102. The source and drain regions are constituted by, an n-type extension diffusion layer (second semiconductor region) 105 using, for example, As as an impurity, source and drain silicides (source electrode and drain electrode) 107 made of, for example, nickel silicide (NiSi), and an $n^+$-type high-concentration impurity layer (third semiconductor region) 106 using, for example, As as an impurity. The $n^+$-type high-concentration impurity layer 106 is formed between the source and drain electrodes 107 and the silicon substrate 100 and the n-type extension diffusion layer 105. The $n^+$-type high-concentration impurity layer 106 has an impurity concentration higher than that of the n-type extension diffusion layer 105. The impurity of the $n^+$-type high-concentration impurity layer 106 is formed by segregating the impurity of the n-type extension diffusion layer 105 in manufacturing of the source and drain electrodes 107.

A characteristic feature of the embodiment is to have a structure in which, as shown in FIG. 1, an interface of the source and drain silicides 107 is separated (offset) from the gate side wall insulating film 104 (L1>0).

As described above, when the structure in which the interface of the source and drain silicides 107 is separated from the gate side wall insulating film 104 is employed, a conspicuous operation and effect that suppress a decrease in injection rate of carriers from the source are obtained.

Figure 2:
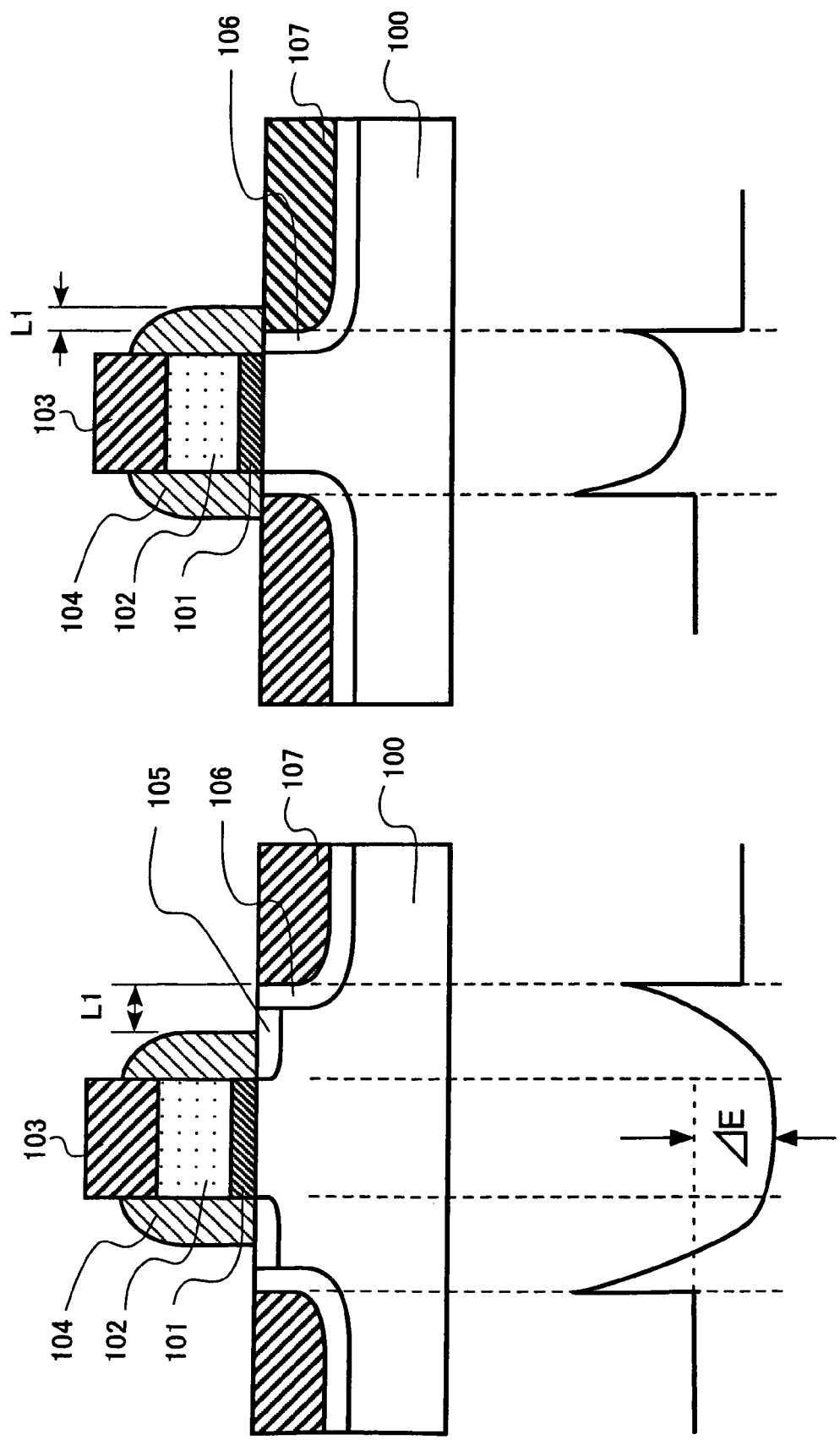
FIGS. 2A and 2B are band diagram for explaining operation and effect of the first embodiment.

The operation and effect of the embodiment will be described below with reference to the band diagram in FIGS. 2A and 2B. FIG. 2A includes a sectional view and a band diagram of a field effect transistor according to the embodiment in which a gate side wall insulating film is separated from a source-drain silicide interface (L1>0). FIG. 2B includes a sectional view and a band diagram of a field effect transistor using a conventional Schottky source and drain in which a gate side wall insulating film is overlapped on a source-drain silicide (L1≦0).

In the embodiment, as shown in FIG. 2A, an energy difference (ΔE) is given between a Fermi level of the source and a potential top of the channel to increase an injection rate of carriers. However, as shown in FIG. 2B, when a source metal or a source silicide is excessively close to a gate electrode as in a conventional field effect transistor, a Schottky barrier of the source moderates a gate electric field to make it impossible to increase the injection rate of carriers. In particular, in the interface between the gate side wall insulating film 104 and an upper layer film thereof, an electric flux line of the gate electric field which goes around the gate electrode from the gate electrode side surface is terminated. For this reason, especially when the interface of the source-drain silicide 107 is overlapped on the gate side wall insulating film 104 (L1≦0), a gate electric field moderating effect achieved by the Schottky barrier of the source becomes conspicuous to decrease the energy difference. Therefore, a decrease in injection rate of carriers from the source becomes large. Therefore, the structure of the embodiment in which the interface of the source-drain silicide 107 is separated (offset) (L1>0) from the gate side wall insulating film 104 is employed to make it possible to obtain the operation and effect that suppress a decrease in injection rate of carriers from the source.

The operation and effect of the embodiment are especially effective when the material constituting the gate side wall insulating film has a dielectric constant higher than that of the upper layer film of the gate side wall insulating film, for example, when the gate side wall insulating film and the upper layer film are a silicon nitride film and a silicon oxide film, respectively. This is because convergence of an electric line of force on the interface of the gate electric field which goes around the gate electrode from the gate electrode side surface becomes conspicuous. However, when the dielectric constants are equal to each other, for example, even though both the gate side wall insulating film and the upper layer film are silicon nitride films, the electric line of force of the gate electric field is terminated due to the influence of an interface level existing on the interface. For this reason, the operation and effect as those described above are obtained as well.

A simulation result of characteristics of the field effect transistor according to the embodiment will be described below with reference to the drawings. In the simulation, as reference values of respective parameters, a gate length (L)=30 nm, an equivalent oxide thickness (EOT) of a gate insulating film=1.2 nm, a side wall thickness of the gate side wall insulating film=8 nm, and a separation distance (L1) between the gate side wall insulating film and the source-drain silicide interface=10 nm are set. Parameters to which conditions are not assigned are calculated to be fixed to the reference values. The side wall thickness and the separation distance (L1) are calculated such that the side wall thickness and the separation distance are symmetrically changed with respect to a gate in both the side directions. With respect to an increasing rata of a drain current, a field effect transistor using a diffusion layer as a source-drain having an equivalent standby current characteristic is used as an object to be compared.

Figure 3:
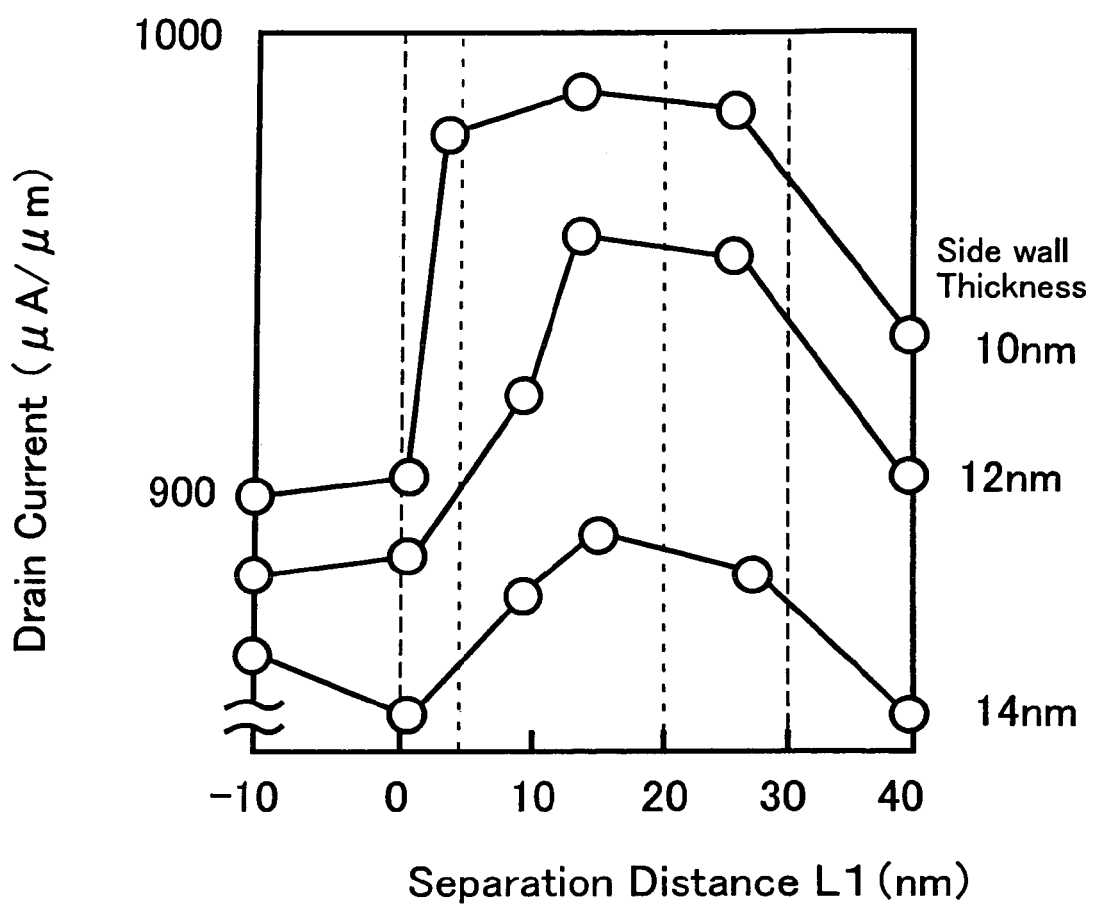
FIG. 3 is a diagram showing a dependence of a drain current on a separation distance.

FIG. 3 shows dependence of a drain current on a separation distance (L1) between the gate side wall insulating film and the source-drain silicide interface. The gate side wall thickness is calculated from three conditions (10 nm, 12 nm, and 14 nm). As is apparent from FIG. 3, it is observed that, regardless of the side wall thickness, the drain current sharply increases from a region in which the separation distance L1 exceeds 0. Furthermore, when the separation distance increases, the drain current begins to decrease. This is because a diffusion layer resistance increases when the length of separation portion increases.

According to the above result, the separation distance L1 is desirably larger than 0 and 30 nm or less. This is because in the region a drain current becomes larger than that of a conventional field effect transistor in which a source-drain silicide interface and a side wall insulating film overlap. Furthermore, the separation distance L1 is desirably 4 nm or more and 20 nm or less. This is because a drain current has a maximal value in this region.

Figure 4:
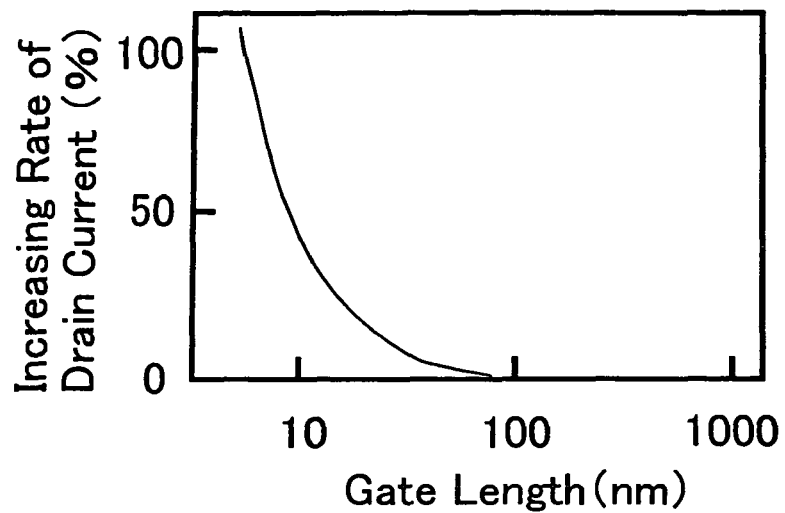
FIG. 4 is a diagram showing a dependence of an increasing rate of the drain current in a gate length.

FIG. 4 shows a dependence of an increasing rate of a drain current on a gate length (L). As is apparent from FIG. 4, in the field effect transistor according to the embodiment, as a gate length decreases, a drain current characteristic is improved in comparison with a conventional field effect transistor in which a diffusion layer is used as a source-drain region. When the gate length becomes short, i.e., when a channel length becomes short, a channel resistance becomes relatively small to a parasitic resistance. For this reason, the effect of the embodiment which increases an injection rate of carriers more conspicuously appears.

According to the above result, the gate length (L) is desirably 80 nm or less which is equal to or more than that of a conventional field effect transistor. Furthermore, the gate length (L) is desirably less than 30 nm where an increasing rate of the drain current is 10% or more (1.1 times the drain current).

Figure 5:
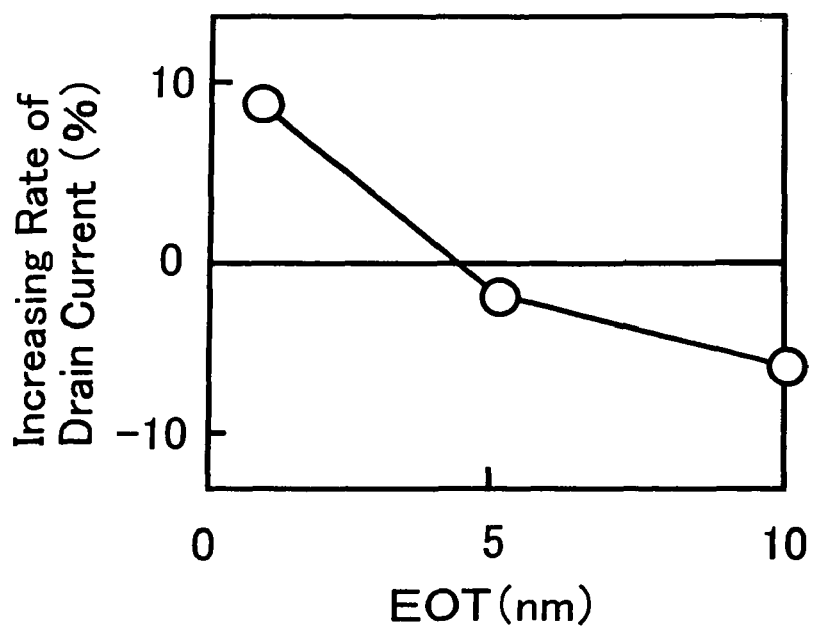
FIG. 5 is a diagram showing a dependence of an increasing rate of the drain current on EOT.

FIG. 5 shows a dependence of an increasing rate of a drain current on a gate insulating film EOT. As is apparent from FIG. 5, in the field effect transistor according to the embodiment, as the EOT decreases in thickness, a drain current characteristic is improved in comparison with a conventional field effect transistor in which a diffusion layer is used as a source-drain region. This is because the EOT decreases in thickness to make it possible to more effectively modulate a potential of the segregation layer 106 (FIG. 1) through the n-type extension diffusion layer 105 (FIG. 1). Therefore, the injection rate of carriers can be improved without increasing a parasitic resistance.

According to the above result, the gate insulating film EOT is desirably set at 4 nm or more which is equal to or larger than the characteristic of the conventional field effect transistor such that an increasing rate of the drain current is 0% or more. Furthermore, the gate insulating EOT is desirably 1.3 nm or less at which the drain current further increases.

Figure 6:
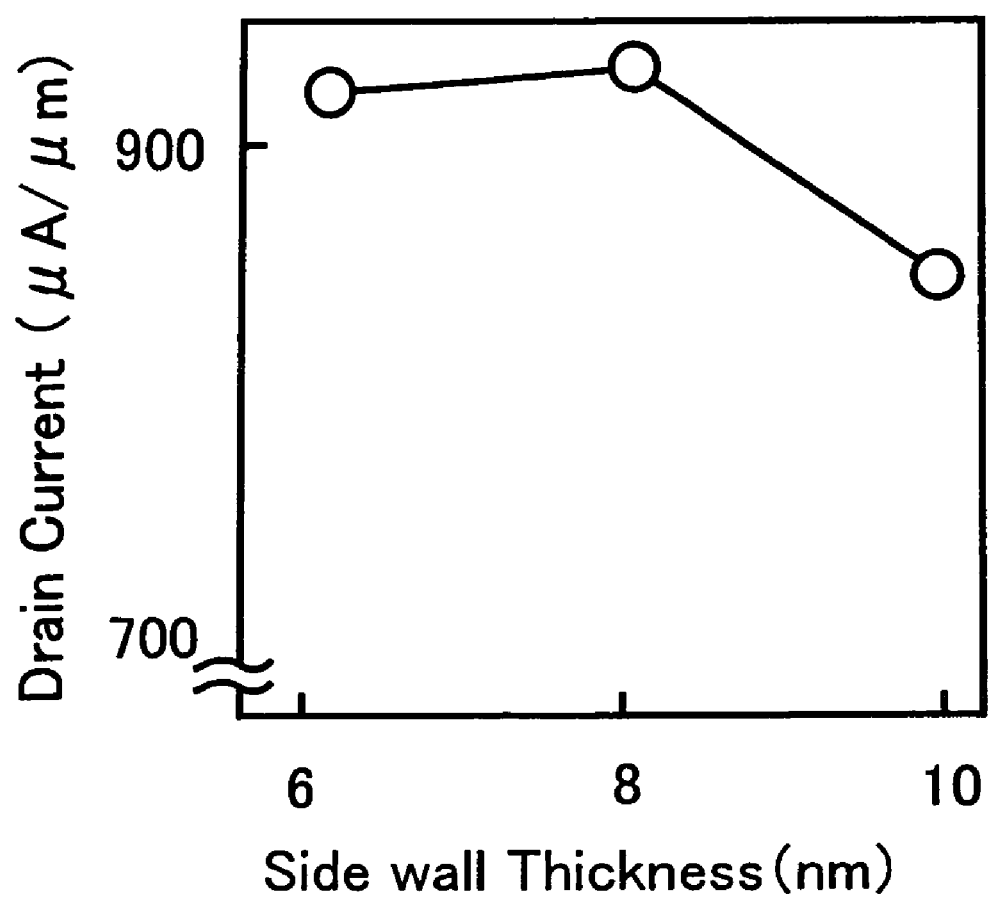
FIG. 6 is a diagram showing a dependence of the drain current on a side wall thickness.

FIG. 6 shows a dependence of a drain current of the gate side wall insulating film thickness. As is apparent from FIG. 6, in the field effect transistor according to the embodiment, a drain current characteristic is deteriorated as the side wall thickness increases. This is because, when the side wall thickness increases, influence of a parasitic resistance of an extension diffusion layer under the side wall increases.

According to the above result, the side wall thickness is desirably 10 nm or less at which deterioration of a drain current characteristic is not conspicuous, and is more desirably 8 nm or less at which the deterioration of the drain current characteristic is not observed.

In the field effect transistor according to the embodiment, an impurity concentration of the $n^+$-type high-concentration impurity layer 106 in interfaces between the impurity layer and the source and the drain electrode is desirably $8\times10^{19}$ to $5\times10^{20}$ atoms/cm$^3$, and an impurity concentration at a depth of 20 nm from the interfaces between the impurity layer and the source and drain electrode is desirably 1/10 or less the impurity concentration in the interfaces between the impurity layer and the source and drain electrode. More specifically, a depth of a point at which an impurity concentration decreases to 1/10 from the interface is desirably 20 nm or less. This is because, when the concentration in the interface is equal to or less than the above value, the current decreases due to an insufficient decrease of a Schottky barrier. When the depth of the point at which the impurity concentration decreases to 1/10 from the interface is the above depth or more, an injection rate is decreased by the resistance of an impurity layer in traveling of carriers from the source to the drain.

The n-type extension diffusion layer 105 desirably has a maximum impurity concentration in a gate insulating film interface, the maximum impurity concentration is desirably 1/2 or less the impurity concentration of the n$^+$-type high-concentration impurity layer 106 in the interfaces between the impurity layer 106 and the source and the drain electrode, and an impurity concentration at a depth of 30 nm from the gate insulating film interface is desirably 1/10 or less the concentration in the gate insulating film interface. More specifically, the depth of the point at which the impurity concentration decreases to 1/10 from the interface is desirably 30 nm or less. This is because, when the concentration and the depth are equal to or larger than the given concentration and the given depth, respectively, an off current increases due to the influence of a short channel effect.

A first manufacturing method for the field effect transistor according to the embodiment will be described below with reference to FIGS. 7 to 12.

Figure 7:
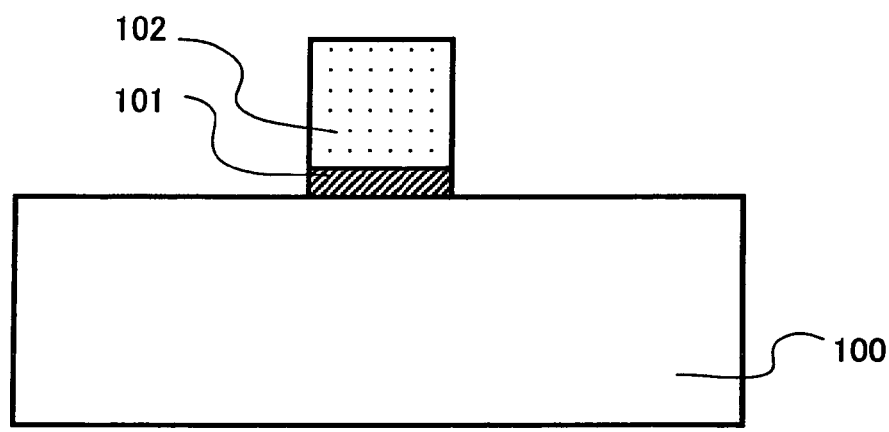
FIGS. 7 to 13 are cross-sectional views showing a first manufacturing step for the MIS field effect transistor according to the first embodiment.

As shown in FIG. 7, a device isolation region (not shown) is formed on the p-type silicon substrate (first semiconductor region) 100 having a (100) orientation plane. Thereafter, the gate insulating film 101 is formed to have an EOT of about 1.2 nm. A polysilicon film serving as the gate electrode 102 is deposited by a low-pressure chemical vapor deposition (to be also referred to as LP-CVD hereinafter) method to have a thickness of about 100 to 150 nm. Subsequently, by a lithography technique and an etching technique such as a reactive ion etching (to be also referred to as RIE hereinafter), the gate insulating film 101 and the gate electrode 102 are formed. If necessary, post oxidation is performed in a thickness of 1 to 2 nm.

Figure 8:
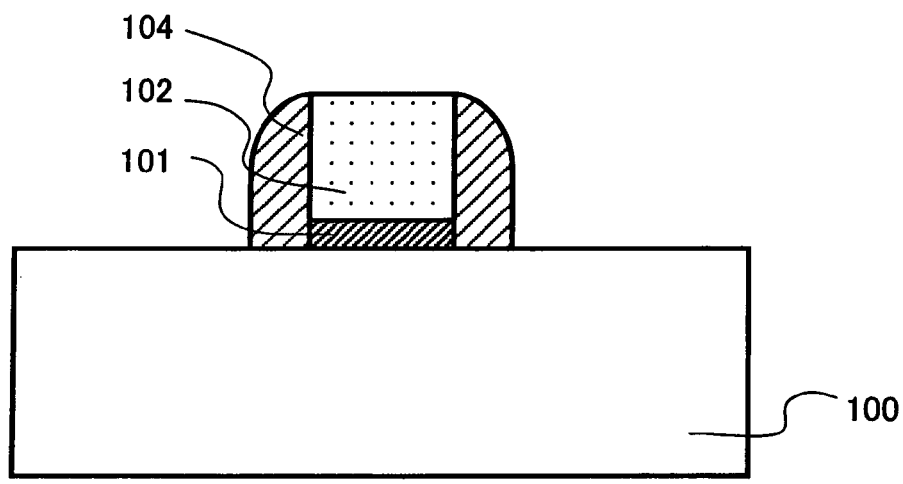

As shown in FIG. 8, a silicon nitride film is deposited by the LP-CVD method to have a thickness of about 8 nm. Thereafter, the silicon nitride film is etched back by the RIE method to cause the silicon nitride film to be left on only a side surface portion of the gate electrode 102. In this manner, the gate side wall insulating film 104 is formed. In this case, only the single silicon nitride film is used as the side wall. However, for example, when a dual side wall insulating film obtained by laminating a TEOS oxide film having a thickness of about 3 nm and a silicon nitride film having a thickness of 5 nm is formed, carrier trap to the lower surface of the side wall insulating film is suppressed. This is more desirable in terms of device reliability.

Figure 9:
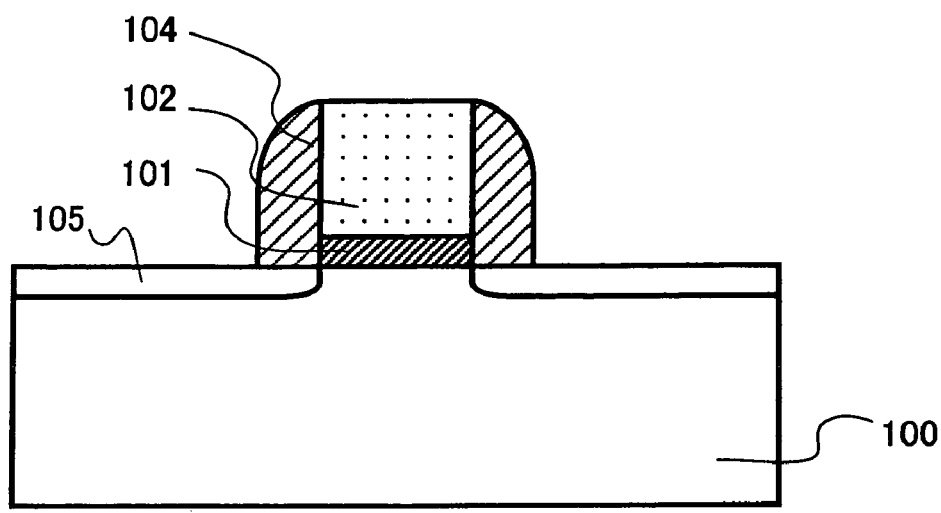

As shown in FIG. 9, As having a dose of $2 \times 10^{15}$ cm$^{-2}$ or more is ion-implanted as an impurity at 2 KeV or less (more desirably, 1 KeV or less) to form the n-type extension layer (second semiconductor region) 105. Here, spike annealing at 1030 to 1050° C. is performed to activate the impurity.

Figure 10:
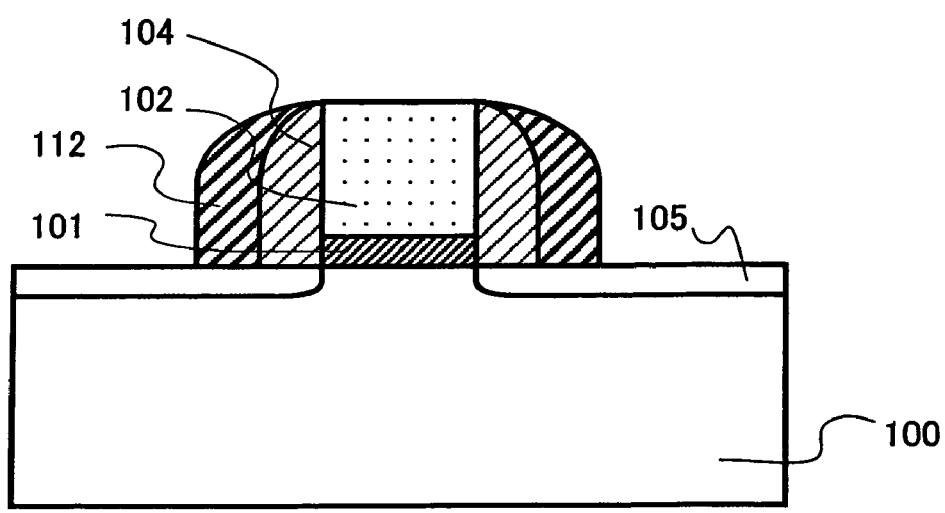

As shown in FIG. 10, a TEOS oxide film is deposited by the LP-CVD method to have a thickness of about 10 nm and etched back by the RIE method to form a second side wall insulating film 112.

Figure 11:
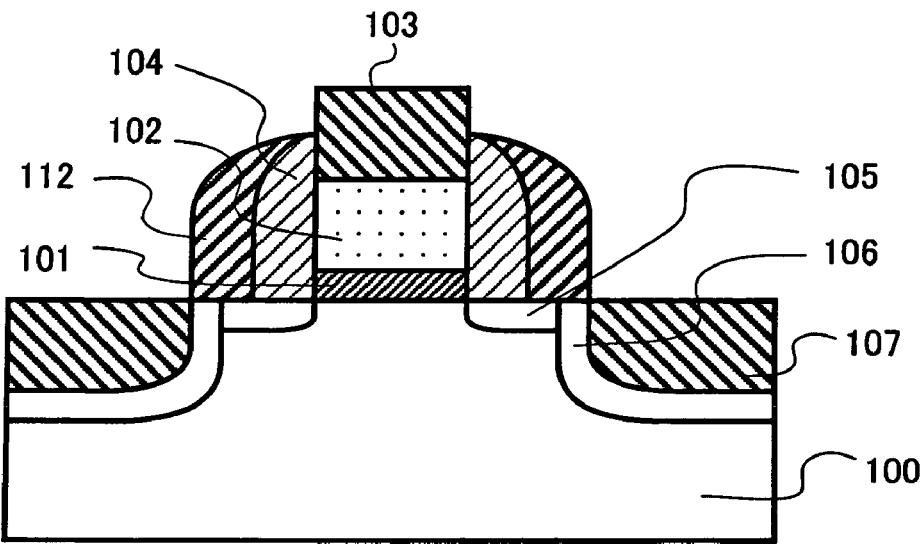

After the surface of the silicon substrate 100 is cleaned with a diluted hydrofluoric acid or the like, Ni is sputtered in a thickness of 7 to 11 nm (more desirably, 9 nm or less) and heat-treated at 350° C. for 30 seconds, as shown in FIG. 11. In this manner, silicon of source, drain, and gate electrodes is silicided. At this time, with respect to the source and drain electrodes, silicide is performed up to a position deeper than the n-type extension layer 105. Thereafter, unreacted Ni is removed with a mixed solution of a sulfuric acid and a hydrogen peroxide solution or the like. Furthermore, heat treatment is performed at 500° C. for about 30 seconds to form the source-drain silicide 107 and the silicon substrate 100 and the gate silicide 103.

At the same time, an As impurity in the n-type extension layer 105 is segregated by siliciding. The n$^+$-type high-concentration impurity layer 106 having a concentration higher than that of the n-type extension layer 105 is formed in the interface between the source-drain silicide 107 and the n-type extension layer 105.

Figure 12:
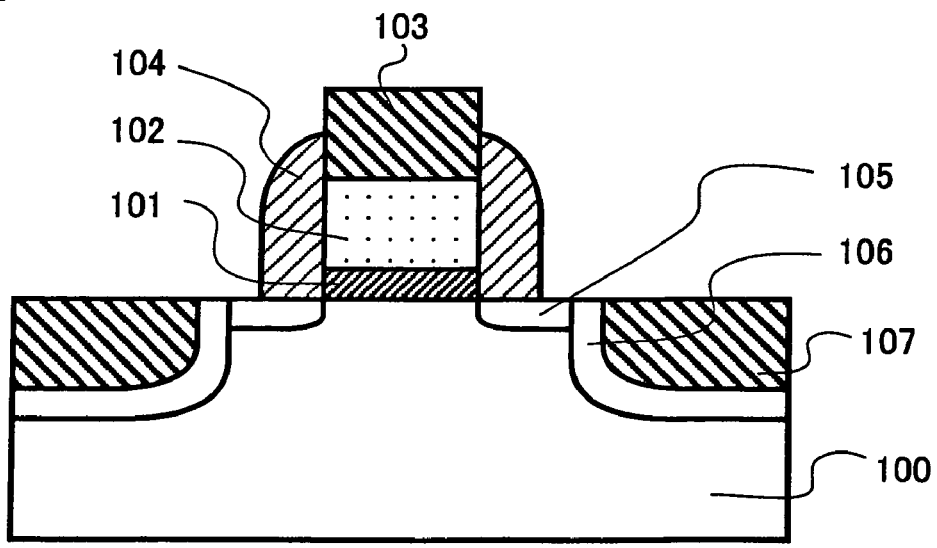

Thereafter, as shown in FIG. 12, the second side wall insulating film 112 formed by the TEOS oxide film is peeled with a diluted hydrofluoric acid or the like to make it possible to obtain the structure shown in FIG. 1.

According to the first manufacturing method described above, the deposited film thickness of the TEOS oxide film forming the second side wall insulating film 112 is changed, so that the separation distance (L1) of the interface between the gate side wall insulating film 104 and the source-drain silicide 107 can be set to a desired value.

Figure 13:
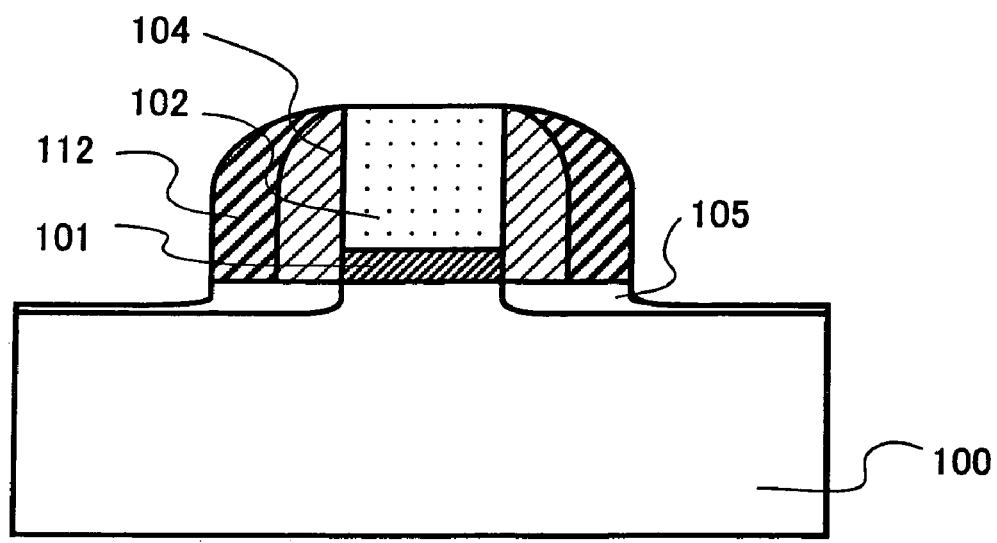

In the first manufacturing method, control of an amount of substrate etching is important when the TEOS oxide film is etched back by the RIE method to form the second side wall insulating film 112. As shown in FIG. 13, depending on conditions in RIE of the TEOS oxide film, the silicon substrate 100 is etched by overetching. In this case, the amount of substrate etching means a thickness at which the silicon is etched from the silicon substrate surface by overetching in a direction of depth in the etch-back operation.

Figure 14:
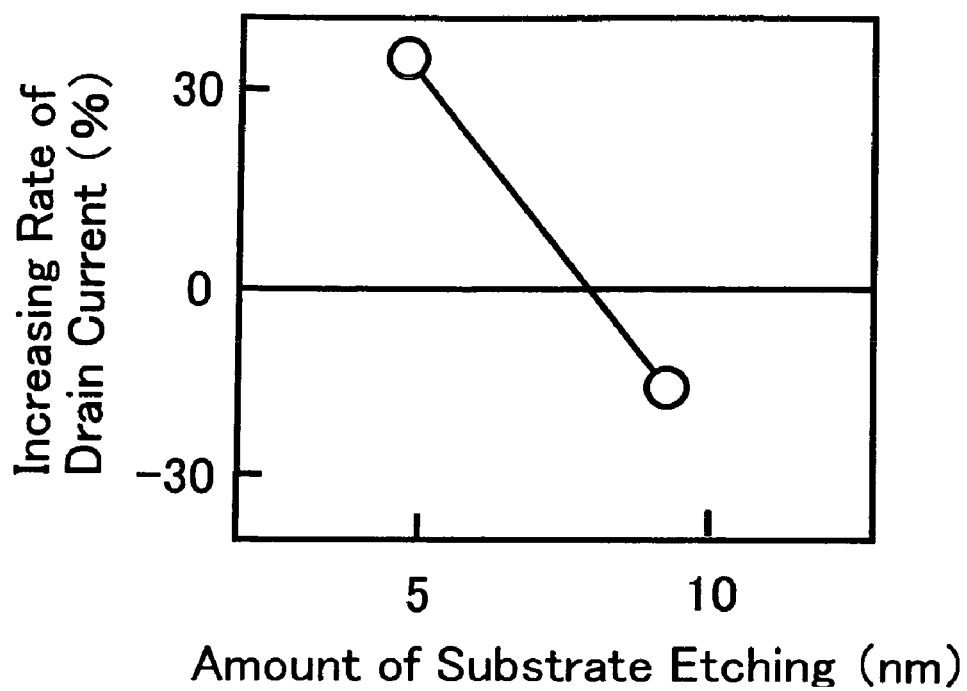
FIG. 14 is a diagram showing a dependence of an increasing rate of the drain current on a substrate etching amount.

FIG. 14 shows a relationship between the amount of substrate etching at this time and an increasing rate of a drain current. In this case, simulation is performed such that parameters other than the amount of substrate etching are fixed to the reference values described above. As is apparent from FIG. 14, as the amount of etching increases, a drain current characteristic is degraded. This is because the separation distance L1 is substantially shortened or the side wall insulating film and the source-drain silicide overlap since formation of the source-drain silicide 107 extends toward the gate insulating film by etching the substrate.

According to the above result, etching conditions and etching time are desirably controlled such that the amount of substrate etching is set to 8 nm or less which obtain a drain current having an increasing rate of 0% or more, i.e., equal to or larger than that of conventional field effect transistor characteristics, more preferably, 6 nm or less at which the drain current further increases.

As shown in FIG. 13, to avoid the increase of parasitic resistance caused by removal of the n-type extension layer 105 formed in advance, the amount of substrate etching is desirably controlled at the minimum.

A second manufacturing method for the field effect transistor according to the embodiment will be described below with reference to FIGS. 15 to 20.

Figure 15:
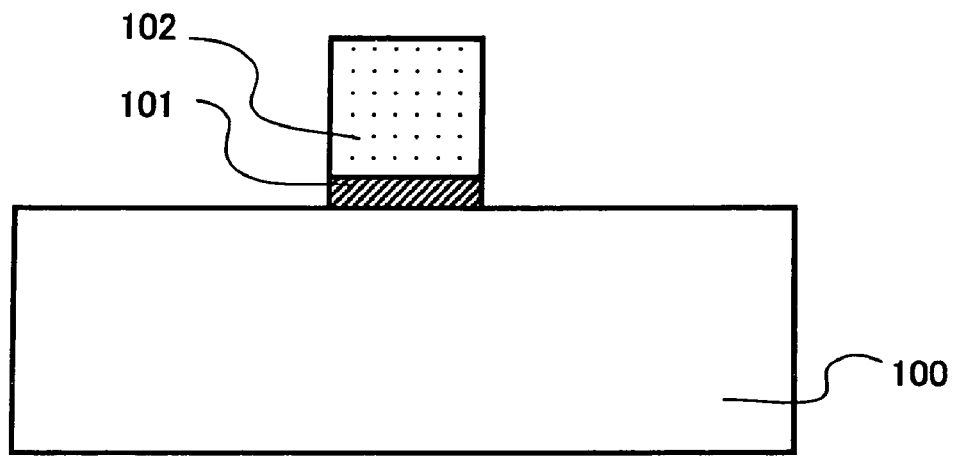
FIGS. 15 to 20 are cross-sectional views showing the second manufacturing step for the MIS field effect transistor according to the first embodiment.

As shown in FIG. 15, the gate insulating film 101 and the gate electrode 102 are formed as in the first manufacturing method. If necessary, post oxidation is performed in a thickness of 1 to 2 nm.

Figure 16:
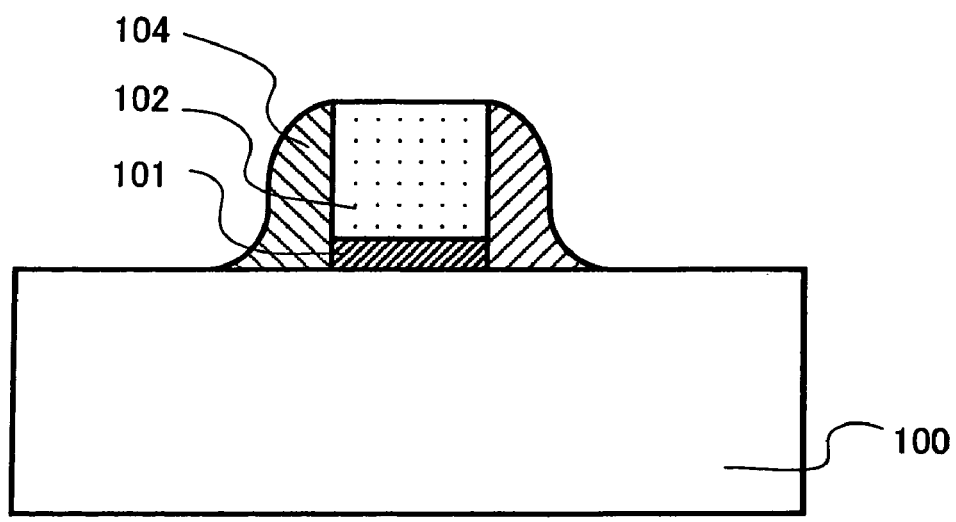

As shown in FIG. 16, a silicon nitride film is deposited by the LP-CVD method to have a thickness of about 8 nm and etched back to form the gate side wall insulating film 104. At this time, the gate side wall insulating film 104 is processed to have a footing-bottom shape (or tailed shape) at a lower side surface as shown in FIG. 16. This process can be performed, for example, by the RIE method with a footing-bottom condition selected. At this time, the degree of footing bottom is controlled by etching conditions to control a final separation distance L1.

Figure 17:
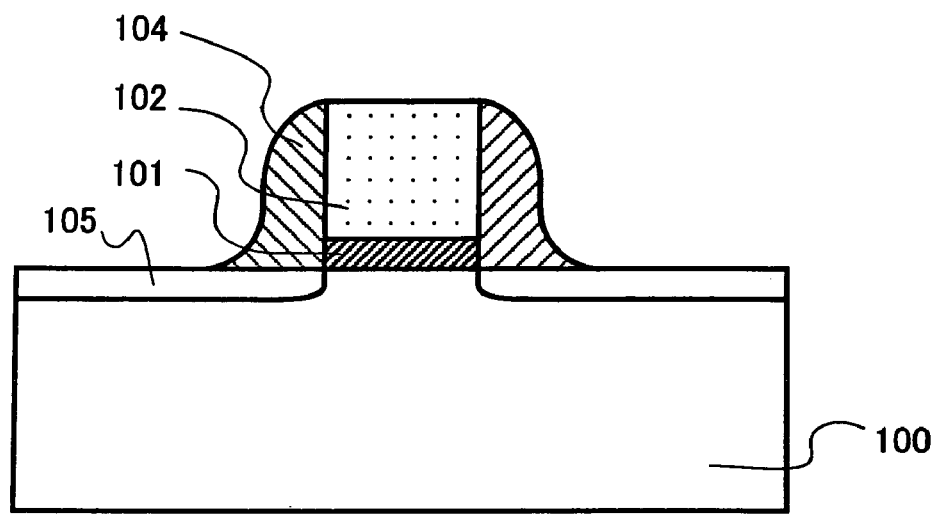

As shown in FIG. 17, the n-type extension layer 105 is formed and activated by the same method as the first manufacturing method.

Figure 18:
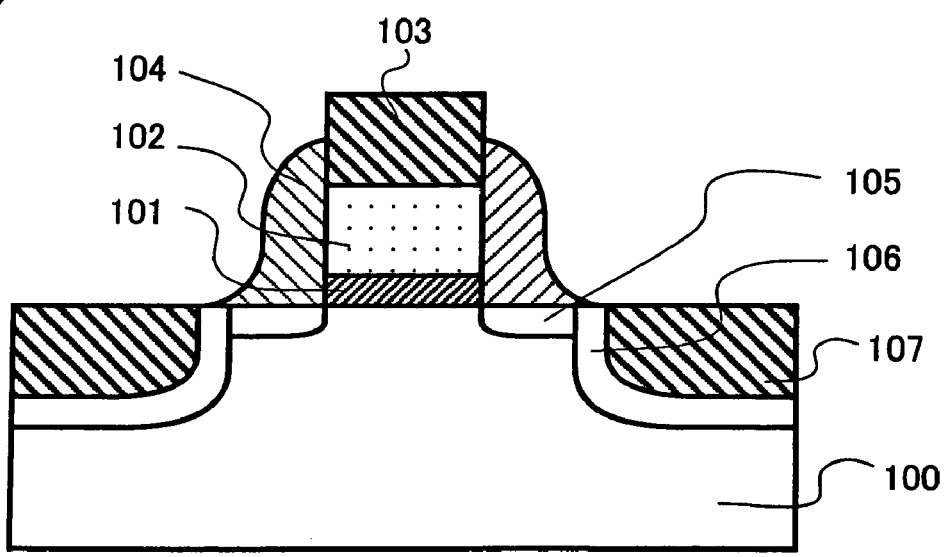

As shown in FIG. 18, the source-drain silicide 107 and the gate silicide 103 are formed as in the same method as the first manufacturing method. At the same time, the $n^+$-type high-concentration impurity layer (third semiconductor region) 106 is formed in the interface between the source-drain silicide 107 and the silicon substrate 100. At this time, the interface of the source-drain silicide 107 is located near the foot of the gate side wall insulating film 104.

Figure 19:
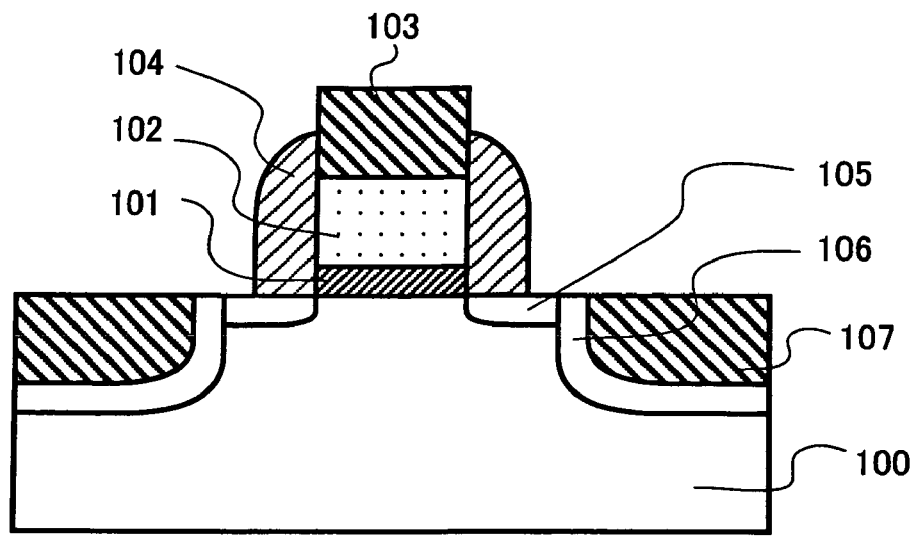

Thereafter, as shown in FIG. 19, the foot of the gate side wall insulating film 104 is removed to obtain the structure shown in FIG. 1. The removal of the foot may be performed by a wet etching process after the formation of the source-drain silicide 107 or may be performed by an RIE method having strong isotropy.

According to the second manufacturing method described above, the step of forming a second sidewall insulating film is unnecessary. For this reason, the manufacturing steps of the second manufacturing method can be simplified in comparison with the first manufacturing method.

Figure 20:
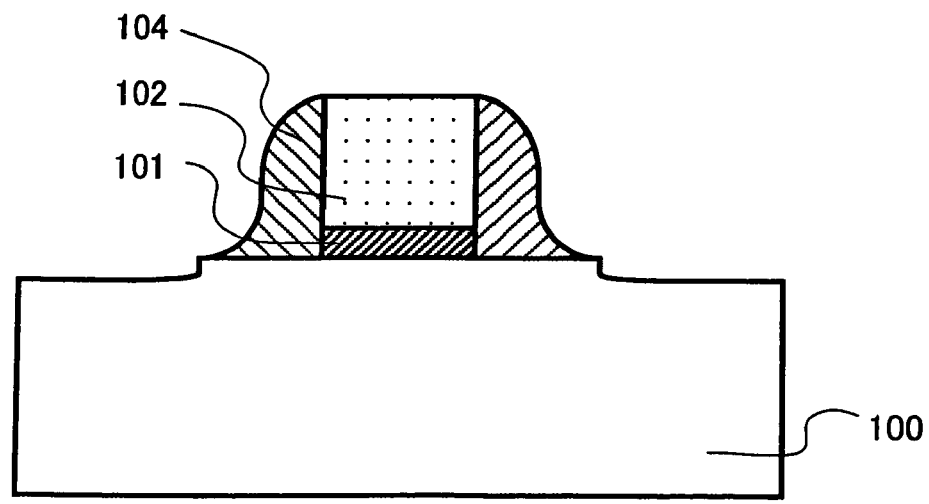

As shown in FIG. 20, also in the second manufacturing method, a problem of etching in the substrate 100 by overetching when the gate side wall insulating film 104 is formed by an etch-back process in the RIE method, and other problems are posed as in the first manufacturing method. Therefore, as in the first manufacturing method, etching conditions and etching time are desirably controlled such that the amount of substrate etching is set to 8 nm or less at which a drain current has an increasing rate of 0% or more, and more preferably, 6 nm or less at which the drain current further increases. However, unlike in the first manufacturing method, the n-type extension layer 105 is formed after the etch-back process in the RIE in the second manufacturing method. For this reason, a problem of removal of the n-type extension layer 105 is not occurred.

Figure 21:
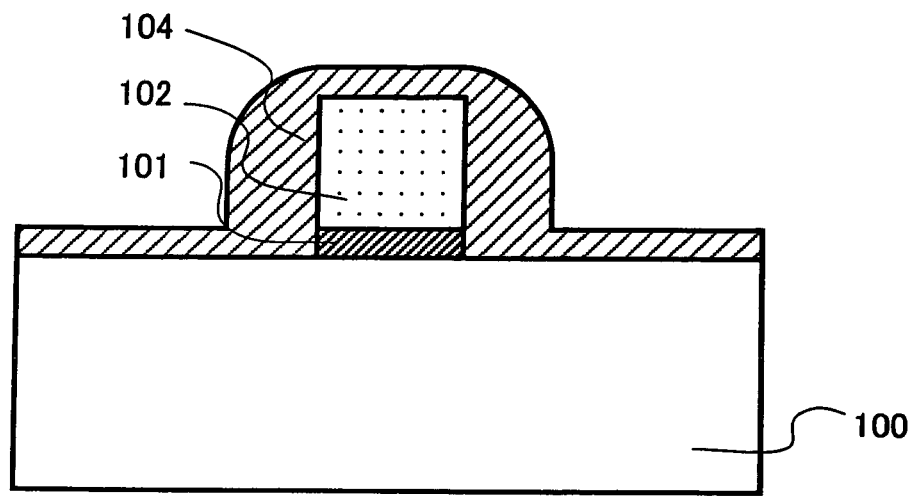
FIGS. 21 to 23 are cross-sectional views showing a third manufacturing step for the MIS field effect transistor according to the first embodiment.

In this case, in order to avoid the silicon substrate 100 from being etched, the following third manufacturing method can also be used. More specifically, as in the first and second manufacturing methods, the gate insulating film 101 and the gate electrode 102 are formed by patterning. Thereafter, as shown in FIG. 21, a silicon nitride film is deposited by the LP-CVD method to have a thickness of about 8 nm. The silicon nitride film is etched back by anisotropic etching such as an RIE method. At this time, a silicon nitride film having a thickness of about 1 nm is left on the surface of the silicon substrate 100. More specifically, the silicon nitride film is maximally etched not to expose the p-type silicon substrate 100.

Figure 22:
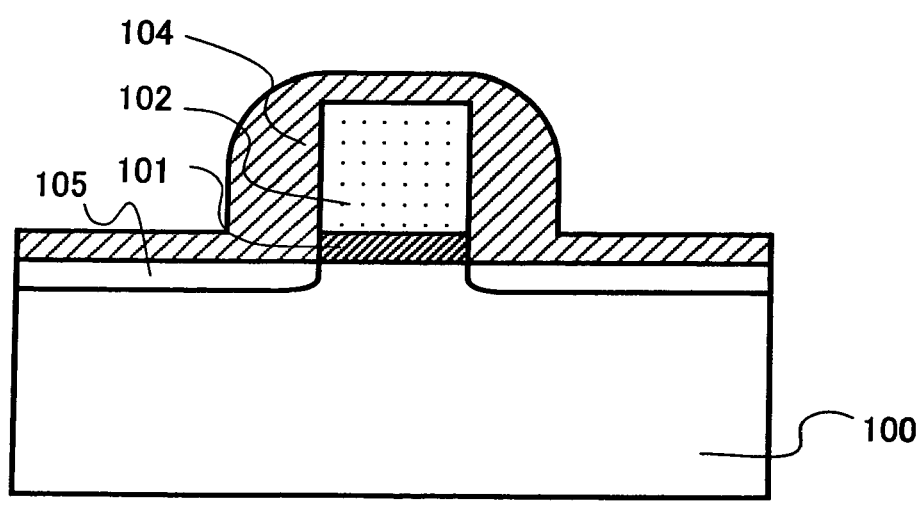

As shown in FIG. 22, As (Arsenic) having a dose of $2 \times 10^{15}$ $cm^{-2}$ or more is ion-implanted as an impurity at 2 KeV or less, more desirably 1 KeV or less, to form the n-type extension layer 105. Here, spike annealing at 1030 to 1050° C. is performed to activate the impurity.

Figure 23:
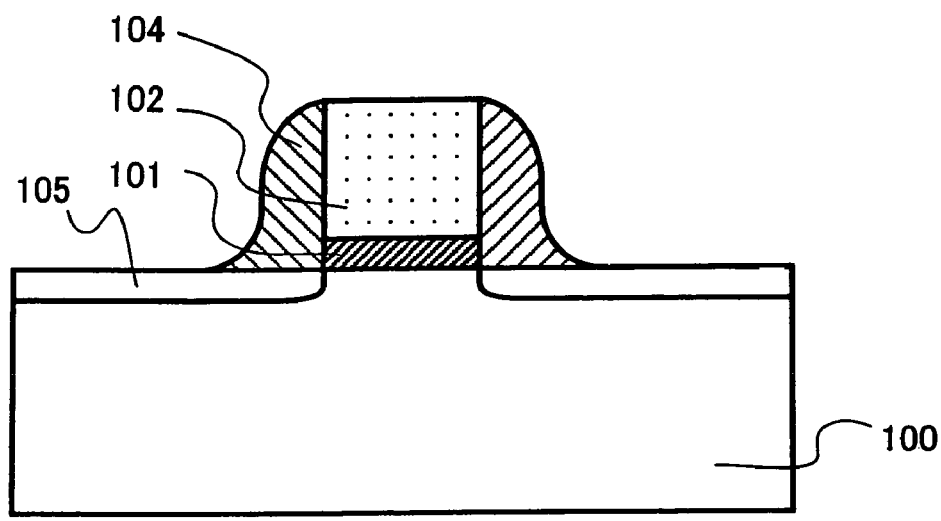

As shown in FIG. 23, the silicon nitride film on the surface of the p-type silicon substrate 100 is removed to form the gate side wall insulating film 104. At this time, the gate side wall insulating film 104, as shown in FIG. 23, is processed to have a footing-bottom shape on the surface of the silicon substrate 100. This process can be performed, for example, by isotropic wet etching such as diluted hydrofluoric acid treatment, high-temperature phosphoric acid treatment, or hydrofluoric glycerol treatment.

The subsequent steps are the same as those in the second manufacturing method. As described above, in removal of the silicon nitride film, the amount of etching of the substrate 100 can be minimized by using wet etching which can have selectivity to the silicon substrate 100 higher than that in the RIE method.

The field effect transistor according to the embodiment described above has a self-aligned silicide structure. An interface between the silicide of the source-drain portion and the silicon substrate is separated from the gate side wall insulating film. The interface is covered with an impurity layer having a steep impurity concentration profile at a desired concentration or more. Therefore, improvement of performance by increasing an injection rate of carriers and improvement of element reliability can be achieved while suppressing punch through and leakage current.

Second Embodiment

Figure 24:
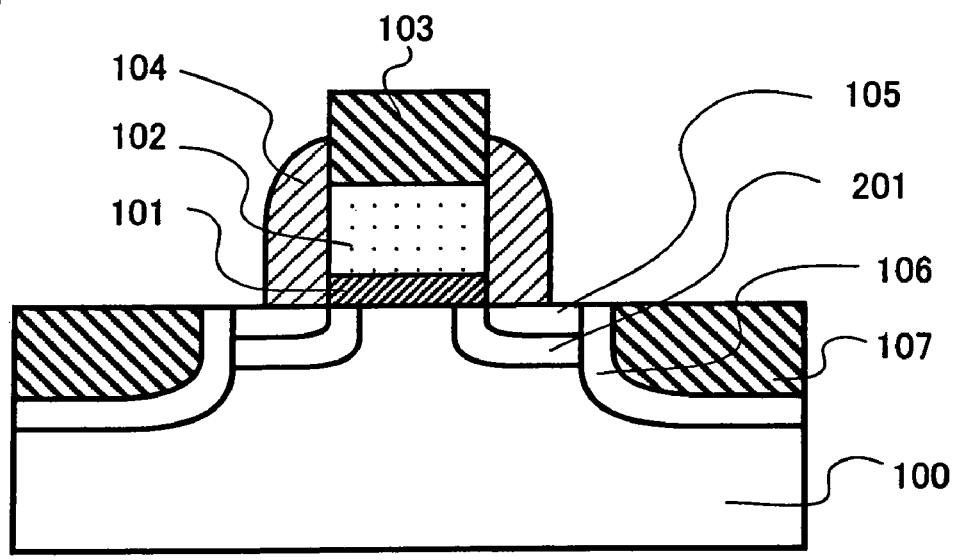
FIG. 24 is a cross-sectional view showing an device structure of a MIS field effect transistor according to a second embodiment.

FIG. 24 is a cross-sectional view showing an device structure of a MIS field effect transistor according to a second embodiment of the present invention. Since the MIS field effect transistor is the same as that in the first embodiment except that an HALO diffusion layer (fourth semiconductor region) 201 is formed, a description thereof will be omitted.

The HALO diffusion layer 201 is a p-type region the impurity type of which is the same as that of a silicon substrate 100, and has an impurity concentration higher than that of the silicon substrate 100 as a characteristic feature. The field effect transistor according to the embodiment includes the HALO diffusion layer 201 to obtain the operation and effect of the first embodiment and to achieve improvement of a roll-off characteristic.

Third Embodiment

Figure 25:
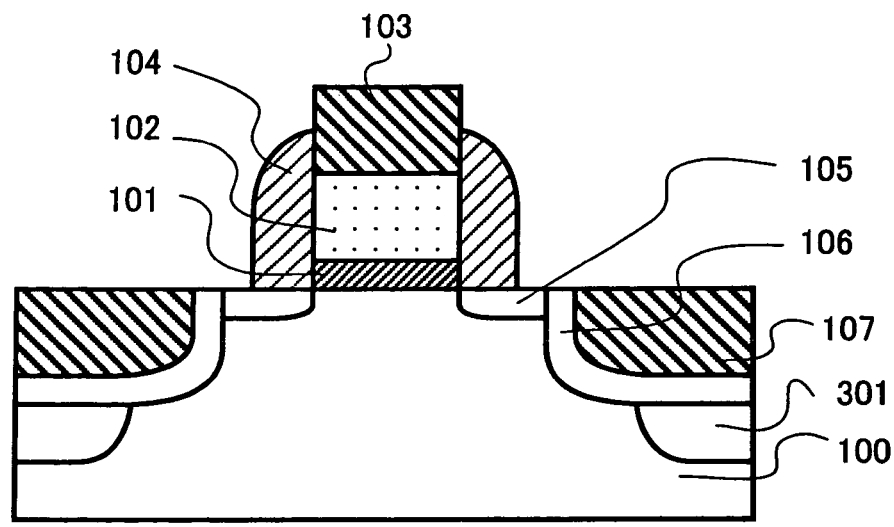
FIG. 25 is a cross-sectional view showing an device structure of a MIS field effect transistor according to a third embodiment.

FIG. 25 is a cross-sectional view showing an device structure of a MIS field effect transistor according to a third embodiment of the present invention. Since the MIS field effect transistor according to the third embodiment is the same as that of the first embodiment except that an $n^+$-type deep diffusion layer (fifth semiconductor region) 301 is formed, a description thereof will be omitted.

The $n^+$-type deep diffusion layer 301 is formed between an $n^+$-type high-concentration impurity layer 106 and the silicon substrate 100, and has a thickness of, for example, about 50 nm.

The field effect transistor according to the embodiment includes the $n^+$-type deep diffusion layer 301 to obtain the operation and effect of the first embodiment and to achieve a considerable reduction in junction leakage from the source-drain bottom portion.

Due to the presence of the $n^+$-type high-concentration impurity layer 106, the $n^+$-type deep diffusion layer 301 can be made shallower or can have a concentration lower than a deep diffusion layer applied to a MOSFET using a normal diffusion layer as a source-drain region. Therefore, it is also a characteristic feature of the embodiment that a punch through current can be suppressed.

Fourth Embodiment

Figure 26:
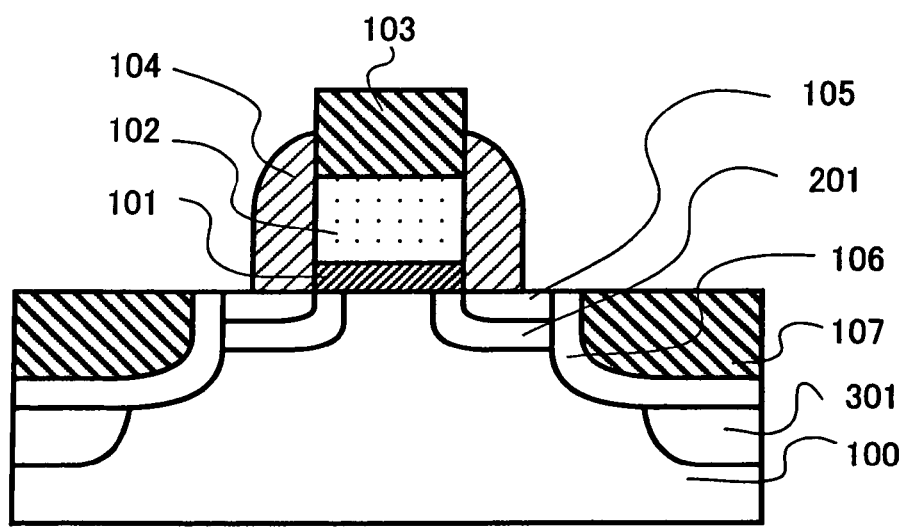
FIGS. 26 to 34 are cross-sectional views showing an device structure of a MIS field effect transistor according to a fourth embodiment.

FIG. 26 is a cross-sectional view showing an element structure of a MIS field effect transistor according to a fourth embodiment of the present invention. Since the MIS field effect transistor according to the fourth embodiment is the same as that of the first embodiment except that an HALO diffusion layer (fourth semiconductor region) 201 and an n+-type deep diffusion layer (fifth semiconductor region) 301 are formed, a description thereof will be omitted.

In this manner, both the HALO diffusion layer 201 and the n+-type deep diffusion layer 301 are formed to make it possible to simultaneously realize improvement of the roll-off characteristic and a considerable reduction in junction leakage as described above.

A method of manufacturing a field effect transistor according to the embodiment will be described below with reference to FIGS. 27 to 34.

Figure 27:
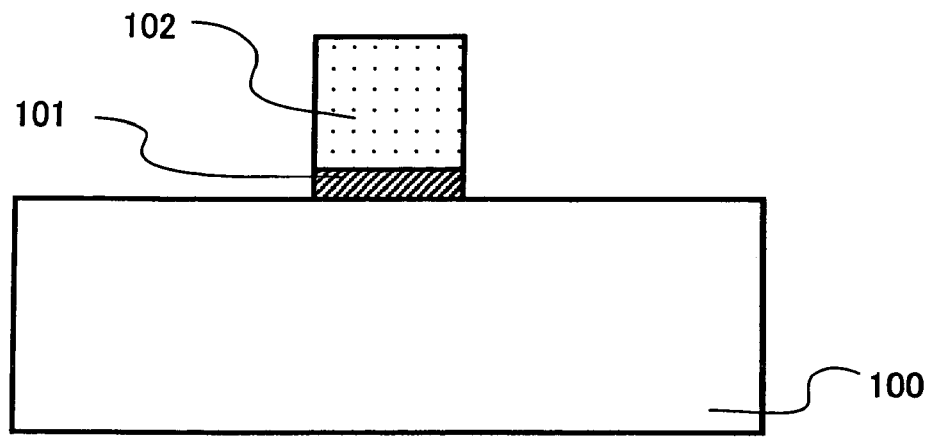

As shown in FIG. 27, an device isolation region (not shown) is formed on the p-type silicon substrate (first semiconductor region) 100 having a (100) orientation plane. Thereafter, the gate insulating film 101 is formed to have an EOT of about 1.2 nm. A polysilicon film serving as the gate electrode 102 is deposited by a low-pressure chemical vapor deposition (to be also referred to as LP-CVD hereinafter) method to have a thickness of about 100 to 150 nm. Subsequently, the gate insulating film 101 and the gate electrode 102 are formed by patterning by a lithography technique and an etching technique such as a reactive ion etching (to be also referred to as RIE hereinafter). If necessary, post oxidation is performed in a thickness of 1 to 2 nm.

Figure 28:
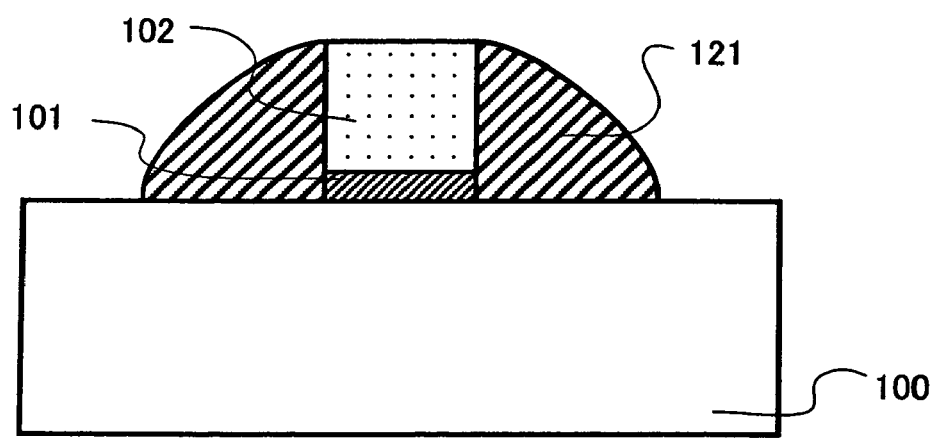

As shown in FIG. 28, a silicon nitride film is deposited by the LP-CVD method or the like to have a thickness of about 24 nm. Thereafter, the silicon nitride film is etched back by the RIE method to form dummy gate side wall insulating films 121 on both the side surfaces of the gate electrode 102.

Figure 29:
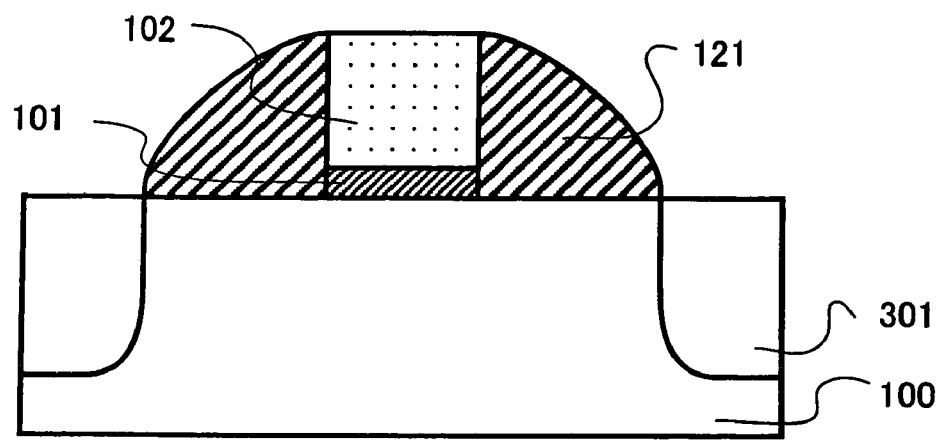

As shown in FIG. 29, As having a dose of $2 \times 10^{15}$ cm$^{-2}$ or more is ion-implanted as an impurity at 25 KeV or less, more desirably, 20 KeV or less, to form the n+-type deep diffusion layer 301. Here, spike annealing at 1050° C. may be performed to activate the impurity.

Figure 30:
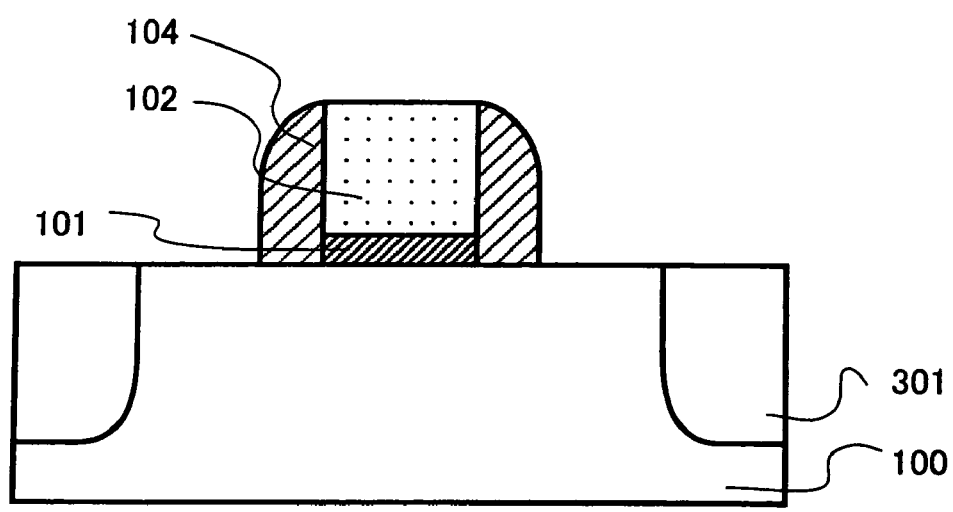

The dummy gate side wall insulating films 121 are removed by wet etching or the like. Subsequently, as shown in FIG. 30, a silicon nitride film is deposited by the LP-CVD method to have a thickness of about 8 nm. Thereafter, the silicon nitride film is etched back by the RIE method to leave the silicon nitride film on only a side surface portion of the gate electrode 102. In this manner, the gate side wall insulating film 104 is formed. In this case, only the single silicon nitride film is used as the side wall. However, a dual side wall insulating film obtained by laminating a TEOS oxide film and a silicon nitride film is desirably formed in terms of reliability as in the first embodiment.

Figure 31:
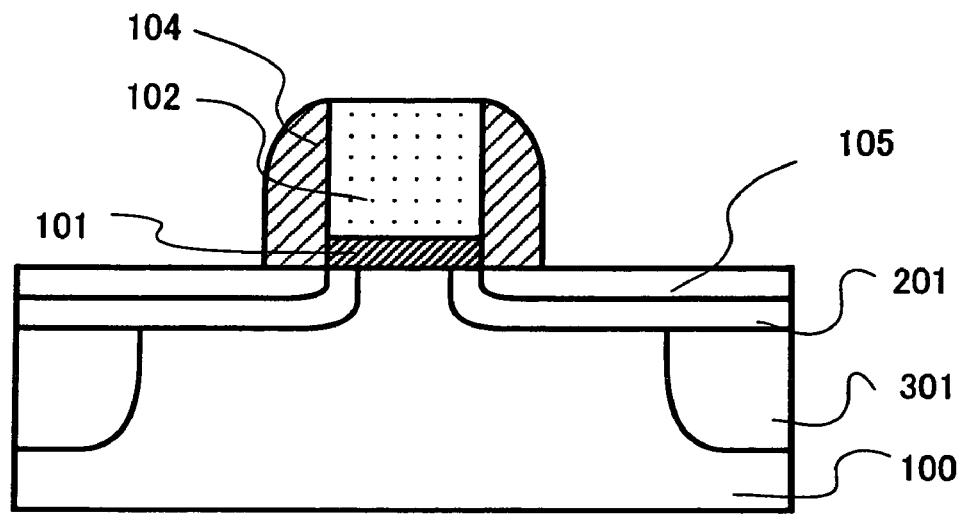

As shown in FIG. 31, As having a dose of $2 \times 10^{15}$ cm$^{-2}$ or more is ion-implanted as an impurity at 2 KeV or less (more desirably, 1 KeV or less) to form the n-type extension layer 105. As an impurity, B or BF$_2$ is ion-implanted to form an HALO diffusion layer 201. Here, spike annealing at 1030 to 1050° C. is performed to activate the impurity.

Figure 32:
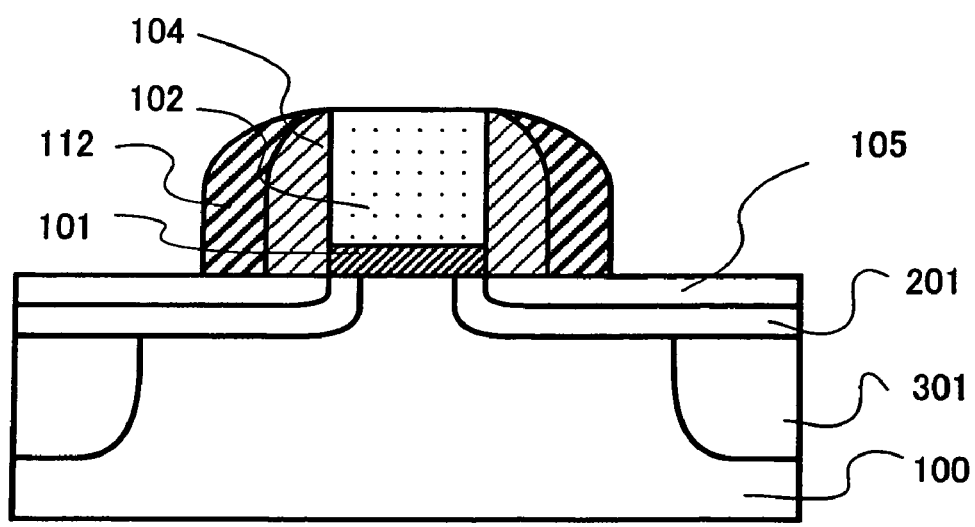

As shown in FIG. 32, a TEOS oxide film is deposited by the LP-CVD method to have a thickness of about 10 nm and etched back by the RIE method to form a second side wall insulating film 112.

Figure 33:
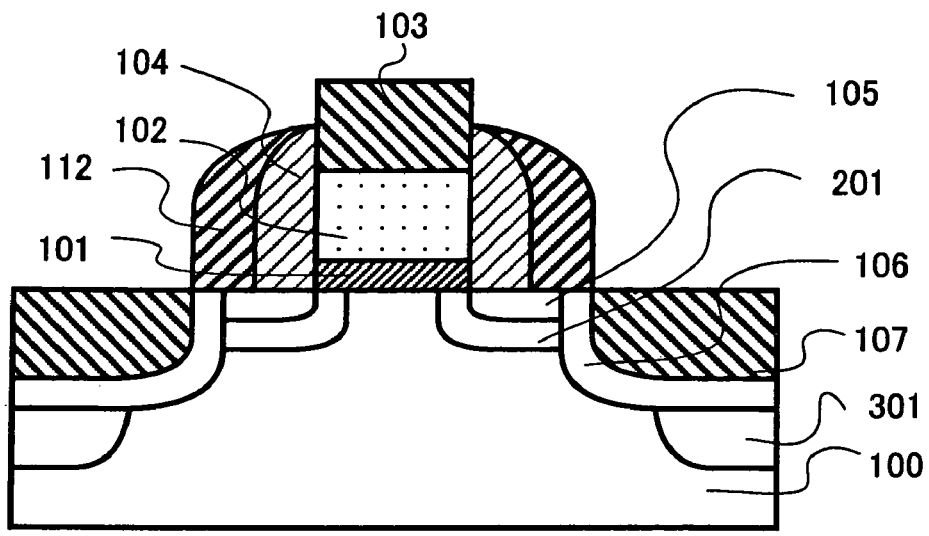

After the substrate surface is cleaned with a diluted hydrofluoric acid or the like, Ni is sputtered in a thickness of 7 to 11 nm (more desirably, 9 nm or less), as shown in FIG. 33. Thereafter, heat treatment is performed at 350° C. for about 30 seconds to silicide silicon of source, drain, and gate electrodes. At this time, with respect to the source and drain electrodes, silicide is performed up to a position deeper than the n-type extension layer 105. Thereafter, unreacted Ni is removed with a mixed solution of a sulfuric acid and a hydrogen peroxide solution or the like. Furthermore, heat treatment is performed at 500° C. for about 30 seconds to form the source-drain silicide 107 and the gate silicide 103. At the same time, an As impurity in the n-type extension layer 105 is segregated by siliciding. In the interface between the source-drain silicide 107 and the silicon substrate 100, the n+-type high-concentration impurity layer 106 is formed.

Figure 34:
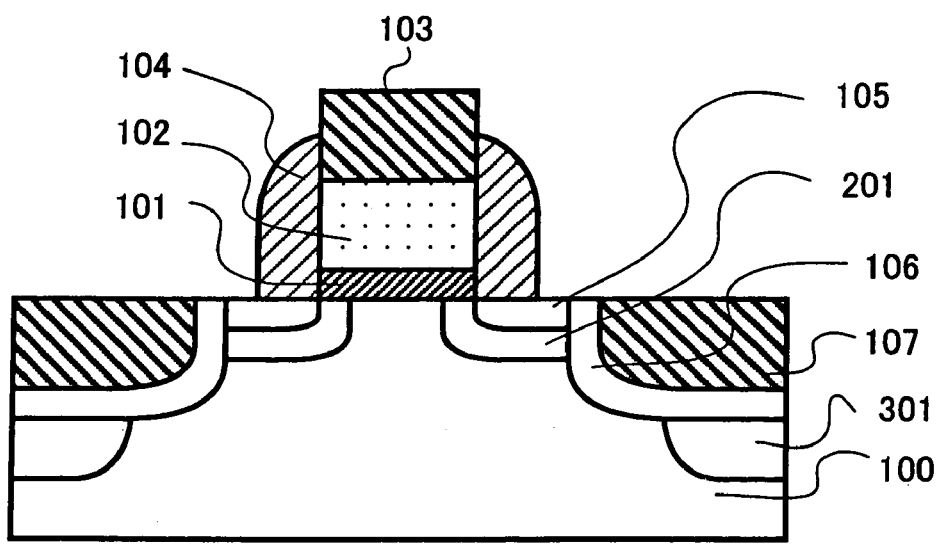

Thereafter, as shown in FIG. 34, the second side wall insulating film formed by the TEOS oxide film is removed with a diluted hydrofluoric acid or the like to obtain the structure shown in FIG. 26.

The present invention is not limited to the above embodiments. In the embodiments, an n-channel MIS field effect transistor is described. However, the present invention can be also applied to a p-channel MIS field effect transistor. In the embodiments, the description is made by using As as impurities in the second and third semiconductor regions, but the impurity is not limited to As. When an n-type semiconductor region is formed, an impurity can also be selected from elements such as P serving as a donor. When a p-type semiconductor region is formed, the impurity can be selected from elements such as B serving as an acceptor. Although silicon is used as a semiconductor substrate material, the semiconductor substrate material is not limited to silicon. Silicon germanium (SiGe), germanium (Ge), silicon carbide (SiC), gallium arsenide (GaAs), aluminum nitride (AlN), or the like can be used.

The orientation of the substrate material is not limited to a (100) orientation plane. A (110) orientation plane, a (111) orientation plane or the like can be properly selected. The present invention can also be applied to any MIS field effect transistor, including a three-dimensional structure such as an Fin structure or a double-gate structure. Furthermore, various modifications of the present invention can be effected without departing from the spirit and scope of the invention.

What is claimed is:

1. A method of manufacturing a semiconductor device, comprising:

preparing a semiconductor substrate;

forming a gate insulating film on a first semiconductor region of a first conductivity type in the semiconductor substrate;

forming a gate electrode on the gate insulating film;

forming first side wall insulating films on both side surfaces of the gate electrode;

ion-implanting an impurity in the first semiconductor region by using the gate electrode and the first side wall insulating film as masks to form second semiconductor regions of a second conductivity type;

forming second side wall insulating films on both side surfaces of the first side wall insulating films, the second side wall insulating films having a film thickness parallel to the substrate of not more than 30 nm;

depositing a metal film directly on the second side wall insulating films and on the second semiconductor regions; and siliciding a part of the second semiconductor region of the second conductivity type to a region deeper than a depth of the second semiconductor regions to form a source electrode and a drain electrode, and forming third semiconductor regions of the second conductivity type having an impurity concentration higher than that of the second semiconductor region in interfaces between the source electrode and the semiconductor substrate and between the drain electrode and the semiconductor substrate.

2. The method according to claim 1, wherein in forming the first side wall insulating film, an amount of substrate etching is not more than 8 nm.

3. The method according to claim 1, wherein the first to third semiconductor regions are made of silicon.

4. The method according to claim 1, wherein the impurity is As, and the silicide is nickel silicide (NiSi).

5. The method according to claim 1, wherein a length of the gate electrode is not more than 80 nm, equivalent physical oxide thickness (EOT) of the gate insulating film is not more than 4 nm, and the first sidewall insulating films have film thickness parallel to the substrate not more than 12 nm substantially even at a bottom portion.

6. The method according to claim 5, wherein the first side wall insulating films have film thickness parallel to the substrate of not more than 10 nm substantially even at bottom portion.

7. The method according to claim 5, wherein the first side wall insulating films have film thickness parallel to the substrate of not more than 8 nm substantially even at a bottom portion.

8. The method according to claim 1, wherein the first side wall insulating films are silicon nitride films.

9. The method according to claim 1, wherein the second side wall insulating films are silicon oxide films.

10. The method according to claim 1, wherein the second semiconductor region of the second conductivity type is silicided to a region deeper than a depth of the second semiconductor regions.

11. The method according to claim 10, wherein the third semiconductor regions are formed simultaneously with the siliciding by segregation of the impurity in the second semiconductor regions during the siliciding.

12. The method according to claim 10, wherein the impurity having a dose of $2\times10^{15}$ cm$^{-2}$ or more is ion-implanted at 2 KeV or less during the ion-implanting.

13. The method according to claim 1, wherein the metal film is Ni film having a thickness of 7 to 11 nm.

* * * * *